(12) United States Patent
Nozaki et al.

(10) Patent No.: US 6,451,501 B1
(45) Date of Patent: Sep. 17, 2002

(54) ACID SENSITIVE COPOLYMER, RESIST COMPOSITION AND RESIST PATTERN FORMING METHOD

(75) Inventors: Koji Nozaki; Ei Yano, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 175 days.

(21) Appl. No.: 09/661,027

(22) Filed: Sep. 13, 2000

Related U.S. Application Data

(63) Continuation of application No. PCT/JP00/00087, filed on Jan. 11, 2000.

(30) Foreign Application Priority Data

Jan. 22, 1999 (JP) ............................................ 11-014479

(51) Int. Cl.$^7$ .............................................. G03F 7/004
(52) U.S. Cl. .................... 430/270.1; 430/326; 525/119; 526/271; 526/272; 526/319
(58) Field of Search .......................... 525/119; 526/271, 526/272, 319; 430/270.1, 326

(56) References Cited

U.S. PATENT DOCUMENTS

| | | | |
|---|---|---|---|
| 5,414,095 A | | 5/1995 | Harris |
| 5,618,884 A | * | 4/1997 | Cai et al. |
| 6,306,990 B1 | * | 10/2001 | Hien et al. |
| 6,369,181 B1 | * | 4/2002 | Jung et al. |

FOREIGN PATENT DOCUMENTS

| | | |
|---|---|---|
| EP | 0 836 119 | 4/1998 |
| EP | 0 880 074 | 11/1998 |
| JP | 2-68563 | 3/1990 |
| JP | 9-90637 | 4/1997 |
| JP | 10-218947 | 8/1998 |
| JP | 10-307401 | 11/1998 |

* cited by examiner

*Primary Examiner*—Rosemary Ashton
(74) *Attorney, Agent, or Firm*—Armstrong, Westerman & Hattori, LLP

(57) ABSTRACT

A chemical amplification resist composition comprising an acid sensitive copolymer wherein the protecting group of a protected carboxyl group bonded to the side chain of a first monomer unit is represented by the following formula (I):

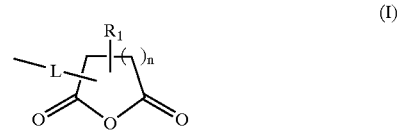

(I)

where $R_1$ represents hydrogen or another substituent, L represents a linking group and n is an integer of 1 to 4, and a second monomer unit has an acidic functional group protected with an acid-unstable protecting group, bonded to its side chain. It can be used to form fine resist patterns that have practically usable sensitivity and undergo no swelling.

14 Claims, No Drawings

ACID SENSITIVE COPOLYMER, RESIST COMPOSITION AND RESIST PATTERN FORMING METHOD

CROSS-REFERENCE TO RELATED APPLICATIONS

This application is a continuation of PCT Application No. PCT/JP/00/00087, filed Jan. 11, 2000.

This application is based upon and claims priority of Japanese Patent Applications No. Hei 11-14479, filed Jan. 22, 1999, the contents being incorporated herein by reference.

TECHNICAL FIELD

The present invention relates to a resist composition and, more specifically, it relates to a resist composition for which shorter wavelength light such as excimer laser light can be used as the image-forming radiation, and which can be developed by a basic aqueous solution after exposure. The present invention further relates to a positive resist pattern forming method employing the resist composition. The resist composition of the present invention can be used to form intricate positive patterns that have practical sensitivity, undergo no swelling and exhibit no peeling. The present invention still further relates to an acid sensitive copolymer useful for the preparation of the resist composition.

BACKGROUND ART

As is well known, the recent trend toward higher integration of semiconductor integrated circuits and the feasibility of VLSIs is leading to wiring patterns with wiring widths on the submicron level. This has rendered essential the establishment of microworking techniques, and in the field of lithography the demand has largely been met by shifting the ultraviolet wavelengths of light exposure sources to shorter wavelengths in the far ultraviolet range, and by developing light exposure techniques employing light sources with wavelengths in the deep ultraviolet range. At the same time, rapid development has been progressing with resist materials that exhibit lower light absorption of the aforementioned shorter wavelengths, have satisfactory sensitivity and also exhibit a high dry etching resistance.

In recent years much research has been conducted in the field of photolithography employing krypton fluoride excimer lasers (wavelength: 248 nm, hereunder abbreviated to KrF) as a new light exposure technique for the manufacture of semiconductor devices, and they have been applied to practical use. Also, H. Ito et al. of IBM, U.S.A. have already developed resist compositions based on the concept of "chemical amplification", as resists with high sensitivity and high resolution that are suitable for such short wavelength light exposure. (See, for example, J. M. J. Frechet et al., Proc. Microcircuit Eng., 260(1982), H. Ito et al., Digest of Technical Papers of 1982 Symposium on VLSI Technology, 86(1983), H. Ito et al., "Polymers in Electronics", ACS Symposium Series 242, T. Davidson ed., ACS, 11(1984), and U.S. Pat. No. 4,491,628). As is readily understood from these publications, the fundamental concept of chemical amplification resist compositions is based on higher sensitivity through an improved apparent quantum yield achieved by a catalytic reaction in the resist film.

There may be cited the very widely used and researched chemical amplification resist type that comprises t-butoxycarbonyl polyvinylphenol (t-BOCPVP) and further contains a Photo Acid Generator (PAG), which has the function of generating an acid upon exposure; to light "post exposure baking" (PEB) of the exposed sections of the resist results in loss of the t-BOC groups to give isobutene and carbon dioxide. The proton acid produced upon loss of t-BOC serves as a catalyst promoting a deprotection chain reaction, which greatly alters the polarity of the exposed sections. With this type of resist, an appropriate developer can be selected to match the large change in polarity of the exposed sections, to easily form a resist pattern.

Recent years have seen abundant research in the field of lithography using even shorter wavelength argon fluoride excimer lasers (wavelength: 193 nm, hereunder abbreviated to ArF) for the fabrication of devices, such as gigabit class DRAMs. For this wavelength, it has been essential to shift away from the base resins that have conventionally been used, i.e. phenolic resins, because of their strong light absorption. Much research and development has been directed toward chemical amplification resists that can be applied to such short wavelengths.

Most conventional chemical amplification resists employ, as the base resins, methacrylic acid-based resins with polycyclic alicyclic ester groups (for example, adamantane, isobornane, tricyclodecane, etc.). (See, for example, K. Nozaki et al., Chem. Mater., 6, 1492(1994), K. Nakano et al., Proc. SPIE, 2195, 194(1994), R. D. Allen et al., J. Photopolym. Sci. Technol., 7, 507(1994)). These chemical amplification resists include alicyclic ester groups in the resins in order to achieve dry etching resistance which is indispensable for resists, but the presence of the alicyclic groups also presents the risk of peeling of the resist during development. Such resists also have insufficient solubility at the exposed sections, and it has therefore been necessary to take compensating measures such as introducing carboxylic acid units into the resin, using more diluted developers, or adding an alcohol such as isopropyl alcohol (IPA).

DISCLOSURE OF THE INVENTION

It is an object of the present invention to solve the problems of the prior art described above by providing a novel resist composition that allows the use of a basic aqueous solution as the developer (a standard alkali developer), that can form fine patterns with practical sensitivity and no swelling, as well as an acid sensitive copolymer that is useful for its preparation.

It is another object of the invention to provide a novel resist composition that is suitable for exposure to light sources in the deep ultraviolet range, typical of which are KrF and ArF excimer lasers, and that also exhibits excellent dry etching resistance.

It is yet another object of the invention to provide a novel resist composition that exhibits excellent adhesion to substrates and can form fine patterns with high sensitivity, high contrast and high resolution.

It is still another object of the invention to provide a resist pattern forming method employing the novel resist composition.

These and other objects of the invention will become readily apparent from the detailed explanation presented below.

As a result of diligent research aimed at achieving the objects mentioned above, the present inventors have completed the present invention upon discovering that, for chemical amplification resist compositions, it is effective to use a film-forming copolymer, with protecting group-containing carboxyl groups on the side chain of one of the monomer units, as the polymer used for the base resin, where a group with a specific acid anhydride portion with weak alkali solubility is used as the protecting group of the carboxyl group in the copolymer, and to combine this with introduction of an additional acidic functional group with an acid-unstable protecting group onto the side chain of one of the other monomer units.

According to one aspect of the present invention, there is provided an acid sensitive copolymer which is formed by copolymerization of two or more different monomers, the polymer being characterized in that (1) it is itself insoluble in basic aqueous solutions, but is rendered soluble in basic aqueous solutions when the protecting group of the protected carboxyl group bonded to the side chain of the first monomer unit of the copolymer is removed by the action of the acid, (2) the protecting group of the carboxyl group comprises an acid anhydride portion represented by the following formula (I):

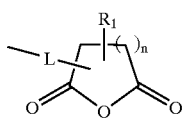

(I)

where $R_1$ represents a hydrogen atom or represents one or more substituents selected from the group consisting of alkyl, alkoxy and alkoxycarbonyl groups, and when more than one $R_1$ substituent is present the substituents may be the same or different, L is either absent or represents a linking group comprising a linear or branched hydrocarbon group of 1 to 6 carbon atoms, and n is an integer of 1 to 4;

(3) the second monomer unit of the copolymer further contains, bonded to its side chain, an acidic functional group protected with an acid-unstable protecting group; and (4) it has a weight average molecular weight of 2,000 to 1,000,000.

According to another aspect of the present invention, there is provided a resist composition capable of being developed in basic aqueous solutions, characterized by comprising (a) an acid sensitive copolymer according to the invention, and (b) a photo acid generator capable of generating an acid that can induce removal of the protecting group of the carboxyl group and the acid-unstable protecting group, when decomposed by absorption of image-forming radiation.

According to still another aspect of the present invention, there is provided a method for the formation of resist patterns which comprises the following steps:

(A) coating a resist composition of the present invention onto a target substrate, (B) selectively exposing the formed resist film to image-forming radiation that can induce decomposition of the photo acid generator of the resist composition, and (C) developing the exposed resist film with a basic aqueous solution.

BEST MODE FOR CARRYING OUT THE INVENTION

The acid sensitive copolymer of the present invention is a novel copolymer that has been achieved based on knowledge obtained through the course of further research on a series of chemical amplification resist compositions hitherto completed by the present inventors, whereby the inventors arrived at the conclusion that it is important for the film-forming polymer used as the base resin to be in the form of a copolymer, for a carboxyl group containing a specific acid anhydride portion as a protecting group to be bonded on the side chain of the first monomer unit of the copolymer, and for an additional acidic functional group with an acid-unstable protecting group to be also bonded on the side chain of the second monomer of the copolymer.

The acid sensitive copolymer of the invention is a copolymer formed by copolymerization of two or more different monomers, i.e. having at least first and second monomer units among the repeating units. The copolymer is not particularly restricted so long as it exhibits the function and effect expected of chemical amplification resist base resins while also satisfying the following 4 conditions.

(1) The copolymer by itself is insoluble in basic aqueous solutions, but can be rendered soluble in basic aqueous solutions when the protecting group of the protected carboxyl group bonded to the side chain of the first monomer unit of the copolymer is removed by the action of the acid.

(2) The protecting group of the carboxyl group of the first monomer unit comprises an acid anhydride portion represented by formula (I) above. Here, $R_1$ in formula (I) represents a hydrogen atom or an optional substituent, for example, an alkyl group such as methyl or ethyl, an alkoxy group such as methoxy or an alkoxycarbonyl group such as methoxycarbonyl. $R_1$ may be two or more substituents if necessary, in which case the substituents may be the same or different. L in the formula is for ester bonding of the protecting group directly to the carboxyl group and therefore is either absent or else represents a linking group comprising a linear or branched hydrocarbon group of 1 to 6 carbon atoms, such as methyl, ethyl or the like. In the formula, n is an integer of 1 to 4.

(3) The second monomer unit of the copolymer further contains, bonded to its side chain, an acidic functional group protected with an acid-unstable protecting group.

(4) It has a molecular weight (weight average molecular weight, Mw) in the range of 2,000 to 1,000,000, and preferably in the range of 3,000 to 50,000.

The protecting group of the carboxyl group in the first monomer unit of the copolymer of the invention, i.e. the acid anhydride portion represented by formula (I), may include various different acid anhydrides depending on the value (1 to 4) of n in the formula, but it is preferably an acid anhydride represented by the following formulas (VI) to (IX) such as succinic anhydride, glutaric anhydride or the like, and even more preferably succinic anhydride.

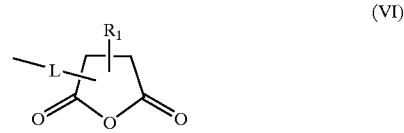

(VI)

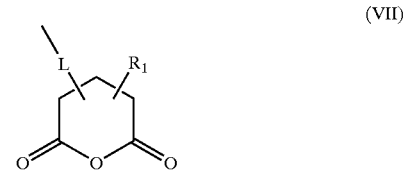

(VII)

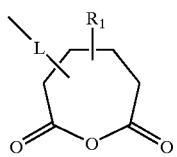
(VIII)

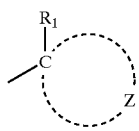
(IX)

The acidic functional group protected with an acid-unstable protecting group in the second monomer of the copolymer of the invention (hereunder referred to as "protecting group-containing functional group") is preferably a carboxyl group protected with a protecting group represented by the following formula (II):

(II)

where $R_I$ represents a linear or branched alkyl group of 1 to 4 carbon atoms such as methyl, ethyl or the like, and it may be either substituted or unsubstituted. Z in the formula represents atoms necessary to complete the alicyclic hydrocarbon group along with the carbon atom to which $R_1$ is bonded. This protecting group-containing carboxyl group is preferably one represented by the following formula (III):

(III)

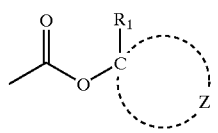

where $R_1$ and Z are both as defined above.

In the protecting group-containing carboxyl group represented by formula (III) above, the alicyclic hydrocarbon group to be included in the protecting group may be any of various publicly known groups in the field of chemical amplification resists. Examples of suitable alicyclic hydrocarbon groups have the following compounds as skeletons.

(1) Adamantane and its derivatives
(2) Norbornane and its derivatives
(3) Perhydroanthracene and its derivatives
(4) Perhydronaphthalene and its derivatives
(5) Tricyclo[5.2.1.0$^{2,6}$]decane and its derivatives
(6) Bicyclohexane and its derivatives
(7) Spiro[4,4]nonane and its derivatives
(8) Spiro[4,5]decane and its derivatives These compounds are represented by the following structural formulas.

 (1)

 (2)

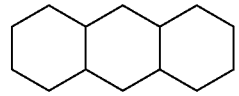 (3)

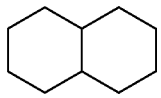 (4)

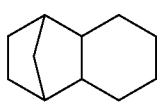 (5)

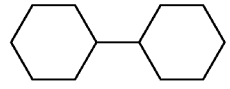 (6)

 (7)

 (8)

When the acid sensitive copolymer of the invention is required to exhibit dry etching resistance comparable to a novolac resist, at least one of the monomer units included as a repeating unit in the copolymer is preferably:

a (meth)acrylate-based monomer unit, i.e. an acrylate-based or methacrylate-based monomer unit,
a vinylphenol-based monomer unit,
an N-substituted maleimide-based monomer unit,
a styrene-based monomer unit
a norbornanecarboxylic acid-based monomer unit or
a monomer unit with an ester group containing a multiple or polycyclic alicyclic hydrocarbon portion. In particular, a (meth)acrylate-based monomer unit is important when deep ultraviolet rays are used as the light exposure source, because it has low absorption of light with a wavelength in the deep ultraviolet region. In other words, when deep ultraviolet rays are used as the exposure light source it is generally preferred to use a copolymer having a structure including no aromatic rings that absorb significant light in the deep ultraviolet region or chromophoric groups with a large molar absorption coefficient, such as conjugated double bonds.

Since an extremely short wavelength exposure light source such as an argon fluoride (ArF) excimer laser may often be used for the invention, it must exhibit dry etching resistance and transparency to the wavelength of the exposure light source (193 nm), and therefore it is preferred to introduce a monomer unit having an ester group containing no strongly absorbing aromatic rings and instead containing a multiple or polycyclic alicyclic hydrocarbon portion, typical of which is an adamantyl group or norbornyl group, which exhibits high dry etching resistance.

Preferred acid sensitive copolymers of the invention may be represented by the following formulas (IV) and (V), particularly in the case of (meth)acrylate-based copolymers.

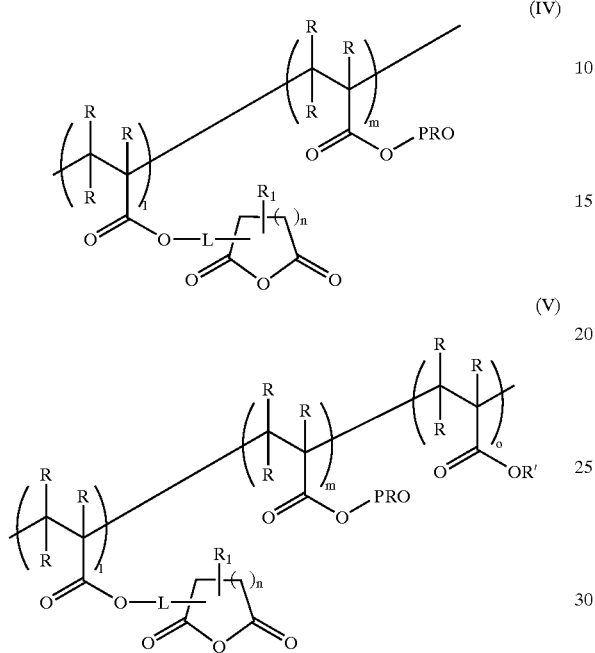

In these formulas, each R may be the same or different and represents a hydrogen atom or represents an optional substituent, for example, a halogen such as chlorine or bromine, a cyano group, a linear or branched alkyl group of 1 to 4 carbon atoms such as methyl or ethyl, a methylol group, or the like. These substituents may be further substituted if necessary, or they may be unsubstituted.

The substituent R' bonded to the side chain of the third monomer unit represents a substituent that may be optionally changed for the resist properties demanded of the acid sensitive copolymer (V), and it preferably represents a hydrogen atom or a linear or branched alkyl group of 1 to 4 carbon atoms such as methyl, ethyl or t-butyl. These substituents may be further substituted if necessary, or they may be unsubstituted.

PRO in the formulas represents an acid-removable protecting group typical of which is t-butyl, tetrahydropyranyl, isobornyl, 2-methyl-2-adamantyl or the like, that can be removed by the action of an acid, and it is preferably a protecting group such as explained for formula (II) above.

$R_1$, L and n in the formulas are each as defined above. The letters l, m and o are the molar ratios of each monomer unit, where l+m=1 or l+m+o=1.

More specifically, acid sensitive two-component copolymers representable by formula (IV) above include, but are not limited to, the copolymers listed below. In the following structural formulas, R, $R_1$, $R_l$, l and m are each as defined above, and the numerals assigned to the acid anhydride portions in the formulas represent the positions to which the substituent $R_1$ may be optionally bonded.

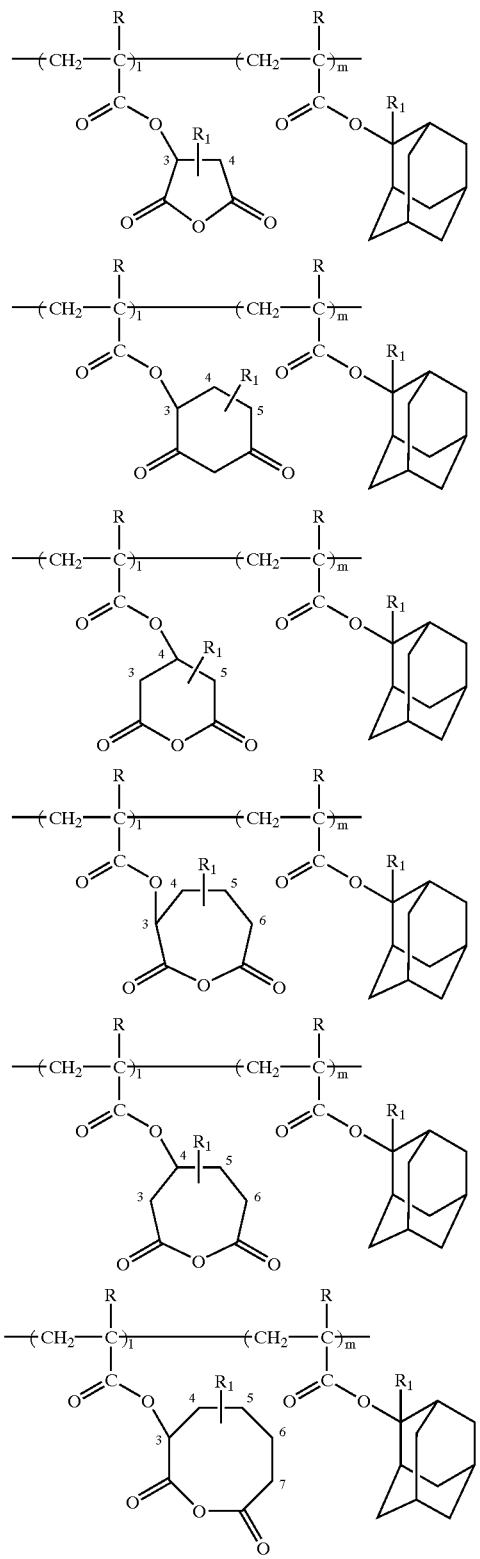

-continued

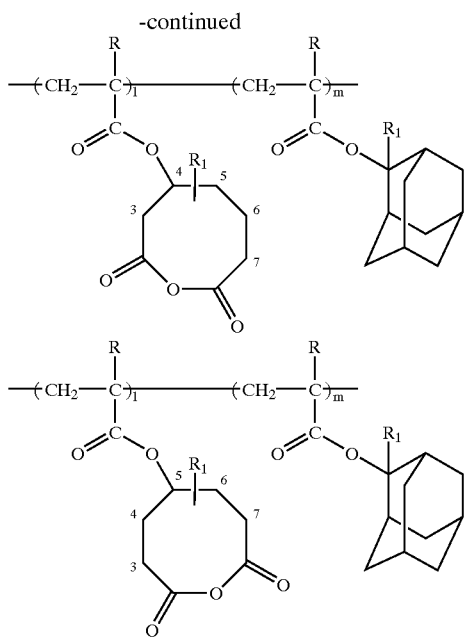

In the acid sensitive two-component copolymers shown above, R, $R_1$ and $R_I$ preferably represent hydrogen atoms or methyl groups, and therefore the compound represented by the following formula is a particularly useful two-component copolymer for the invention.

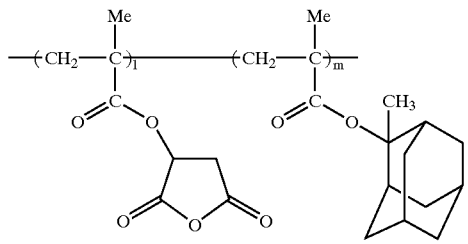

Me represents methyl in this copolymer formula; however, the properties of the resulting resist are the same even if the methyl group is replaced with a hydrogen atom.

Acid sensitive copolymers according to the invention, including the above (meth)acrylate-based copolymers, may be prepared using a polymerization process that is commonly employed in polymer chemistry. For example, as will be explained in greater detail in the examples provided below, a (meth)acrylate-based copolymer of the invention can be successfully prepared by free radical polymerization of the two or more selected monomers in the presence of 2,2'-azobisisobutyronitrile (AIBN) as the free radical initiator. Acid sensitive copolymers other than (meth)acrylate-based copolymers can also be successfully prepared by similar commonly used polymerization processes.

Incidentally, the proportion of the monomer unit containing the acid anhydride portion represented by formula (I) (i.e., the first monomer unit) in the acid sensitive copolymer of the invention is preferably in the range of 20 to 80 mole percent. When the content of this monomer unit is under 20 mole percent, adhesion of the resist with the substrate is impaired making it impossible to achieve satisfactory patterning, and when it is above 80 mole percent the resin itself becomes soluble in basic aqueous solutions. The content of this monomer unit is even more preferably in the range of 30 to 50 mole percent.

The proportion of the monomer unit containing the protecting group represented by formula (II) (i.e., the second monomer unit) in the acid sensitive copolymer of the invention is preferably in the range of 20 to 80 mole percent. This is because a second monomer unit containing the protecting group of formula (II) in its ester portion is the element that provides high dry etching resistance (RIE resistance) and, in order to achieve RIE resistance comparable to that of commonly used novolac resists, the content of the second monomer unit in the copolymer must be in the range of 50 to 80 mole percent. However, when the content of this monomer unit is above 80 mole percent, care must be taken against significant loss of adhesion of the fine patterns.

The acid sensitive copolymer of the invention containing these first and second monomer units preferably has a structure with no conjugated double bonds or aromatic rings, and it is therefore advantageous in terms of transparency for extremely short wavelengths (193 nm) such as from an ArF excimer laser.

The acid sensitive copolymer of the invention may be advantageously used for preparation of chemical amplification resist compositions, being employed as the base resin in combination with a photo acid generator that can generate an acid as a result of decomposition upon absorption of image-forming radiation. For example, (meth)acrylate-based copolymers are well known to have high transparency in the deep ultraviolet range, while in the case of the aforementioned two-component copolymers, neither of the two different ester portions included within the structure contain any chromophores with a large molar absorption coefficient in the wavelength range of 190 to 250 nm; consequently, combination with an appropriate amount of a photo acid generator can give a highly sensitive resist that is advantageously suited for light exposure using deep ultraviolet rays.

According to yet another aspect, therefore, the invention provides a resist composition capable of being developed with a basic aqueous solution, characterized by comprising an acid sensitive copolymer according to the invention and a photo acid generator (PAG) capable of generating an acid that can induce removal of the protecting group of the carboxyl group of the first monomer unit and the acid-unstable protecting group of the second monomer unit, upon decomposition by absorption of image-forming radiation.

The mechanism of chemical amplification with a resist composition of the invention will now be explained in further detail to more fully clarify the gist of the invention.

When the PAG in the resist composition is exposed to image-forming radiation after formation of the resist film, it absorbs the ultraviolet rays and generates an acid. Subsequent heating of the exposed resist film causes the generated acid to act as a catalyst, simultaneously or separately promoting the following reactions A, B and C in the exposed sections of the film.

Reaction A

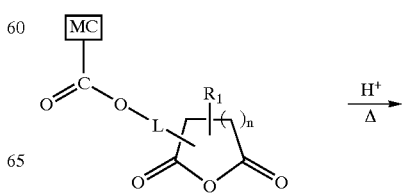

-continued

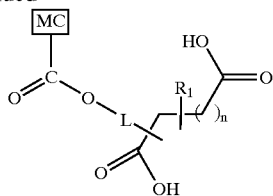

Reaction B

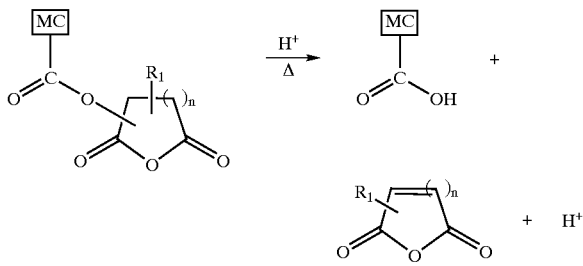

Reaction C

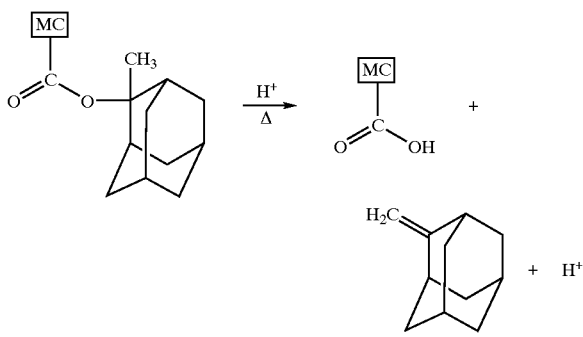

Note: MC means a main chain of the polymer.

Reaction A proceeds with consumption of residual moisture in the resist film. The reaction is therefore complete once the moisture has been consumed to near the reaction point. When no linking group L is present, reaction B also proceeds simultaneously with this reaction, as a reaction that regenerates the proton acid. That is, because the acid sensitive copolymer of the invention has an acid anhydride group that can be easily removed by heating in the presence of an acid catalyst, which has been introduced into the ester portion of the first monomer unit, it is possible to regenerate the proton by its removal and thus achieve high sensitivity. Reaction C is an additional reaction that regenerates the proton acid. That is, since the acid sensitive copolymer of the invention has an acidic functional group that can be easily removed by heating in the presence of an acid catalyst, which has been introduced into the ester portion of the second monomer unit, it is possible to regenerate the proton acid by its removal and thus achieve high sensitivity. Production of carboxylic acid after removal of the functional groups from the first and second monomer units renders the light exposed sections of the resist film soluble in bases, thus allowing development in basic aqueous solutions. The resulting resist pattern has the exposed sections removed by dissolution and thus constitutes a positive pattern. According to the invention, the change in polarity produced in the copolymer is utilized for pattern formation, so that a pattern with no swelling is obtained.

Because the acid sensitive copolymer used as the base resin in the resist composition of the invention has a functional group that can be easily removed by heating in the presence of an acid catalyst in the ester portion of the first monomer unit, and also has a similar functional group in the second monomer unit, it is possible to achieve both high sensitivity and resolution that are superior to copolymers designed to alter the solubility by removal of the functional group of one monomer unit.

The photo acid generator (PAG) used in combination with the aforementioned acid sensitive copolymer in the chemical amplification resist of the invention may be a photo acid generator that is commonly used in the field of resist chemistry, i.e., a substance the produces an acid upon irradiation with radiation such as ultraviolet rays, far ultraviolet rays, vacuum ultraviolet rays, X-rays or the like. Suitable photo acid generators that may be used for the invention include, but are not limited to, those represented by the following formulas.

(1) Onium salts, for example:

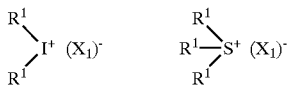

where each $R^1$ may be the same or different And represents, for example, a substituted or unsubstituted aromatic group, such as a phenyl group substituted with phenyl, a halogen, methyl, t-butyl, an aryl group or the like, or an alicyclic group, and $X_1$, represents, for example, $BF_4$, $BF_6$, $PF_6$, $AsF_6$, $SbF_6$, $CF_3SO_3$, $ClO_4$, etc.

(2) Sulfonic acid esters, for example:

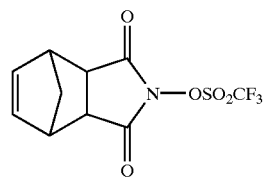

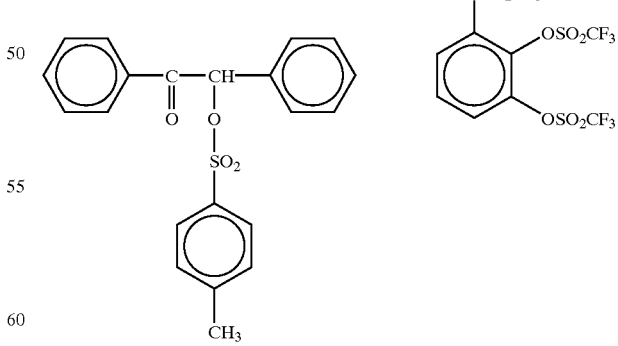

(3) Halogenated compounds, for example:

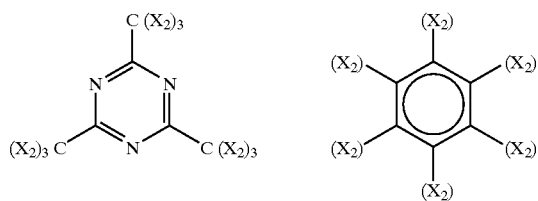

where $X_2$ represents a halogen atom such as Cl, Br or I, each may be the same or different, and one of the —$C(X_2)_3$ groups in the formula may be a substituted or unsubstituted aryl group or alkenyl group.

In addition to these photo acid generators there may be also used, if necessary, the photo acid generators disclosed in Japanese Unexamined Patent Publication (Kokai) No. 9-90637, for example.

The photo acid generators mentioned above can be used in the resist composition of the invention in various amounts suited for the desired effect. The present inventors have found that the photo acid generator is preferably used in a range of 0.1 to 50 wt % based on the total amount of the acid sensitive copolymer used as the base resin. When the amount of the photo acid generator is over 50 wt %, excessive light absorption will prevent successful patterning. The amount of the photo acid generator used is even more preferably in the range of 1 to 15 wt % based on the total amount of the copolymer.

The resist composition of the invention preferably has a specific transmittance at the exposure light wavelength; that is, when the resist composition is used to form a film by application onto a quartz substrate, it preferably has an absorbance of 1.75 $\mu m^{-1}$ at the wavelength of the deep ultraviolet exposure light source (180 to 300 nm), and therefore the structure of the copolymer and photo acid generator and the amount of the photo acid generator should be considered in light of achieving such transmittance.

The resist composition of the invention can usually be advantageously used in the form of a resist solution, by dissolving the aforementioned acid sensitive copolymer and photo acid generator in an appropriate organic solvent. Organic solvents that are useful for preparation of resist solutions include, for example, ethyl lactate, methyl amyl ketone, methyl-3-methoxypropionate, ethyl-3-ethoxypropionate, propyleneglycol methyl ether acetate, etc., but the solvent is not limited to these. These solvents may be used alone, or if necessary two or more solvents may be used in admixture. The amount of these solvents to be used is not particularly restricted, but they are preferably used in an amount sufficient to achieve an appropriate viscosity for coating by spin coating or the like, as well as for the desired resist film thickness.

Co-solvents may also be used with the aforementioned solvent (referred to as "primary solvent") if necessary in the resist solution of the invention. The use of a co-solvent is not necessary when the solubility of the solutes is satisfactory or when the solution can be evenly coated, but in cases where solutes with low solubility are used or the solution cannot be evenly coated as desired, it will usually be added in an amount of preferably 1 to 30 wt % and more preferably 10 to 20 wt %, with respect to the primary solvent. Examples of useful co-solvents include, but are not limited to, butyl acetate, γ-butyrolactone and propyleneglycol methyl ether.

The present invention still further provides a method of forming resist patterns, particularly positive resist patterns., on target substrates using the aforementioned resist composition. The positive resist pattern forming method of the invention is generally carried out in the following manner.

First, the resist composition of the invention is coated onto a target substrate to form a resist film. The target substrate may be a substrate that is commonly used for manufacture of semiconductor devices and other such devices, a few examples of which are silicon substrates, glass substrates, non-magnetic ceramic substrates, compound semiconductor substrates and alumina and other insulating crystal substrates. If necessary, an additional layer such as a silicon oxide layer, a wiring metal layer, an interlayer insulating film, a magnetic film or the like may be present on these substrates, or different wirings, circuits and the like may be built therein. These substrates may be subjected to hydrophobic treatment by common methods to increase the adhesion of the resist film therewith. As an example of an appropriate hydrophobic treatment agent there may be mentioned 1,1,1,3,3,3-hexamethyldisilazane (HMDS).

As mentioned above, the resist composition is usually coated onto the target substrate in the form of a resist solution. The coating of the resist solution may be accomplished by a common technique such as spin coating, roll coating, dip coating or the like, but spin coating is particularly useful. The thickness of the resist film is not particularly restricted, but is normally preferred to be in the range of about 0.1 to 200 $\mu m$ and, in the case of exposure with KrF light, for example, the recommended range is about 0.1 to 1.5 $\mu m$. The thickness of the resist film to be formed can be varied within a wide range depending on such factors as the purpose for which the resist film will be used.

The resist film coated onto the substrate is preferably prebaked at a temperature of about 60 to 180° C. for about 30 to 120 seconds prior to its selective exposure with the image-forming radiation. The prebaking may be carried out using common heating means for resist processes. As examples of suitable heating means there may be mentioned a hot plate, an infrared heating oven, a microwave heating oven, or the like.

The prebaked resist film is then selectively exposed to image-forming radiation with a conventional light exposure apparatus. Suitable light exposure apparatuses include commercially available ultraviolet ray (far ultraviolet ray, deep ultraviolet ray) exposure apparatuses, X-ray exposure apparatuses, electron beam exposure apparatuses, excimer steppers and the like. The light exposure conditions may be selected as appropriate for the procedure. As was mentioned above, excimer lasers (KrF lasers with a wavelength of 248 nm and ArF lasers with a wavelength of 193 nm) are particularly advantageous as light exposure sources for the invention. Throughout the present specification, therefore, the term "radiation" will mean light from these various types of light sources, i.e. ultraviolet rays, far ultraviolet rays, deep ultraviolet rays, an electron beam (EB), X-rays laser light and the like. The selective light exposure results in absorption of the radiation by the acid sensitive copolymer in the light exposed regions of the resist film by the mechanism described above, resulting in its decomposition and rendering the light exposed regions soluble basic aqueous solutions.

The exposed resist film is then subjected to post exposure baking (PEB) to cause an acid-catalyzed reaction to remove the protecting groups. The conditions for the post exposure baking are not particularly limited so long as they cause the intended deprotection reaction, and for example, the baking may be carried out under the same conditions as the previous prebaking. For example, the post exposure baking temperature may be about 60 to 180° C., and preferably about 100 to 150° C., with a baking time of about 30 to 120 seconds. The baking conditions are preferably adjusted according to the desired pattern size, form, etc.

After completion of the post exposure baking, the exposed resist film is developed in a basic aqueous solution as the developer. For the development there may be used a common developing apparatus such as a spin developer, dip developer, spray developer or the like. The type of basic aqueous solution that may be advantageously used as the developer in this case is an aqueous solution containing the hydroxide of a metal of Group I or II of the Periodic Table, typical of which is potassium hydroxide, or an aqueous solution of an organic base containing no metal ions, such as a tetraalkylammonium hydroxide. The basic aqueous solution is more preferably an aqueous solution of tetramethylammonium hydroxide (TMAH) or tetraethylammonium hydroxide (TEAH). The basic aqueous solution may also contain an additive such as a surfactant to enhance the developing effect. The development results in dissolution and removal of the exposed regions of the resist film, leaving a resist pattern of only the unexposed regions on the substrate.

The present invention still further provides a process for manufacture of semiconductor devices using a resist pattern formed according to the method of the invention as the masking means. The semiconductor device manufacturing process of the invention is characterized by comprising the following steps:

(A) coating of a resist composition according to the invention onto a target substrate, (B) selectively exposing the formed resist film to image-forming radiation capable of inducing decomposition of the photo acid generator in the resist composition, (C) developing the exposed resist film with a basic aqueous solution to form a resist pattern, and (D) etching the underlying target substrate for its removal, using the resist pattern as the masking means.

According to this manufacturing process, the step of forming the resist film, the step of selective light exposure with radiation and the step of forming the resist pattern may each be successfully accomplished in the manner described above.

The subsequent step of etching the resist pattern may be accomplished by wet etching or dry etching according to a common technique, but considering the recent progress in fine fabrication and the trend toward environmental friendliness, dry etching is more advantageous. As is well known, dry etching accomplishes etching of a target substrate in a gas phase, and examples of suitable dry etching techniques are plasma etching techniques, such as reactive ion etching (RIE), reactive ion beam etching (RIBE) and ion beam etching. These dry etching techniques may be carried out under prescribed conditions using commercially available etching apparatuses.

For most purposes, the resist pattern formed by the method of the invention can be advantageously used as masking means for selective etching removal of an underlying target substrate in the manner described above, but so long as the resist pattern satisfies the prescribed conditions in terms of required properties, it can also be used as one of the elements of a semiconductor device, for example, as an insulating film itself.

The term "semiconductor device" as used throughout the present specification refers to semiconductor devices in the general sense and is not particularly limited. As is generally recognized in the technical field, typical semiconductor devices include common semiconductor integrated circuits such as ICs, LSIs and VLSIs, as well as other related devices.

More specifically, a MOS transistor, which is a typical instance of a semiconductor device, may be manufactured according to the invention in the following manner for illustration.

First, a gate oxide film, a polysilicon film and a WSi film that are necessary for construction of a transistor are formed in that order as thin films on a silicon substrate. The thin films may be formed using a common thin film forming technique such as thermal oxidation, chemical vapor deposition (CVD) or the like.

Next, the resist composition of the invention is coated onto the WSi film to form a resist film of the prescribed thickness. The resist film is selectively exposed to radiation suitable for the patterning, and it is then developed in a basic aqueous solution for dissolution and removal of the exposed region. More specifically, the series of steps to this point may be carried out in the manner described above for formation of the resist pattern.

In order to form a gate electrode structure, the resist pattern formed in the manner described above is used as a mask for simultaneous dry etching of the underlying WSi film and the polysilicon film under it. After thus forming a gate electrode comprising a polysilicon film and a WSi film, phosphorus is injected by ion injection to form an N$^-$ diffusion layer for an LDD structure.

Next, after the resist pattern used in the previous step is released off from the electrode, an oxide film is formed over the entire surface of the substrate by CVD, and the formed CVD oxide film is subjected to anisotropic etching to form a side wall on the side of the gate electrode formed by the polysilicon film and WSi film. The WSi film and side wall are then used as a mask for ion injection to form an N$^+$ diffusion layer, thereby coating the gate electrode with a thermal oxidation film.

Finally, an interlayer insulation film is formed over the entire uppermost layer of the substrate by CVD, and the resist composition of the invention is again coated thereover and selectively etched to form a hole pattern (resist pattern) in the wiring formation sections. The resist pattern is used as a mask for etching of the underlying interlayer insulation film, to form contact holes. The formed contact holes are then filled in with aluminum (Al) wiring. An N-channel intricate MOS transistor is thus completed.

EXAMPLES

The present invention will now be explained by way of several examples relating to synthesis of acid sensitive copolymers, preparation of resist compositions and formation of resist patterns. The examples which follow are only presented for illustration and are not meant to limit the scope of the invention.

Example 1

Synthesis of Methacryloxysuccinic Anhydride

After equipping a thoroughly dried 200 ml-volume three-necked flask with a dropping funnel, a calcium chloride tube and a nitrogen inlet tube, the system atmosphere was charged with nitrogen gas. A stirrer bar coated with Teflon™ was then added into the flask together with 50 ml of dry methylene chloride, 5.0 g (43.1 millimoles) of 2-hydroxysuccinic anhydride and 4.79 g (47.4 millimoles) of dry triethylamine, and the mixture was stirred at 0° C. under the nitrogen atmosphere. To this solution there was added, dropwise and over the period of an hour, 4.50 g (43.1 millimoles) of methacryloyl chloride that had been already placed in the dropping funnel, and then the mixture was stirred at room temperature for 2 hours. After confirming consumption of the starting materials by thin-layer chromatography, the reaction solution was transferred to a 300 ml separatory funnel and washed with 100 ml of water and saturated saline in that order. The aqueous phase was then extracted 3 times with methylene chloride. The organic layer was collected and dried over sodium sulfate anhydride. The dried organic layer was filtered with filter paper and the solvent in the filtrate was distilled off under reduced pressure. This yielded a brown oil. The oil was purified by silica gel chromatography to obtain methacryloxysuccinic anhydride as a colorless transparent oil. The yield was 6.75 g (85%).

Example 2

Synthesis of Methyacryloxysuccinic Anhydride/2-methyl-2-adamantyl Methacrylate Copolymer A stirrer bar coated with Teflon™ was added into a thoroughly dried 100 ml Erlenmeyer flask together with 3.24 g (17.6 millimoles) of the methacryloxysuccinic anhydride prepared in Example 1, 3.51 g (14.4 millimoles) of 2-methyl-2-adamantyl methacrylate, 788 mg (4.8 millimoles, 15 mole percent) of azobisisobutyronitrile (AIBN) and 10.7 ml of dioxane, and the mixture was stirred at 70° C. for 8 hours under a nitrogen atmosphere. The resulting highly viscous reaction solution was added dropwise to 1 liter of hexane to produce a precipitate. The produced precipitate was filtered with a glass filter and dried for a period of 6 hours in a vacuum oven at 45° C. The resulting white powder was dissolved in tetrahydrofuran (THF) and subjected twice to the aforementioned procedure from hexane precipitate production through drying. Finally, it was dried for a period of 18 hours in a vacuum oven at 45° C. to obtain a white copolymer powder having the structural formula shown below. The yield was 5.75 g (85.2%).

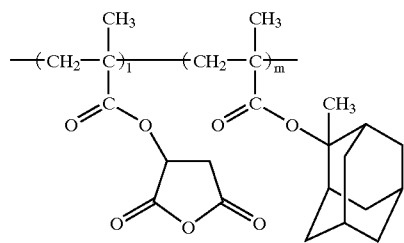

$^1$H-NMR analysis revealed that the copolymerization ratio of the obtained copolymer (l:m), or succinic anhydride:adamantyl, was 51:49. The absorbance of the copolymer was 0.046 $\mu m^{-1}$ at a wavelength of 248 nm and 0.22 $\mu m^{-1}$ at 193 nm (film thickness: 1 $\mu m$, on quartz substrate), demonstrating excellent transparency. The other analysis results were as follows.

Weight average molecular weight: 16,100 (based on standard polystyrene)

Degree of dispersion (Mw/Mn): 1.92.

Example 3

Formation of Resist Pattern

The methyacryloxysuccinic anhydride/2-methyl-2-adamantyl methacrylate copolymer synthesized in Example 2 was dissolved in propyleneglycol methyl ether acetate (PGMEA) to make a 15 wt % solution. To this copolymer solution there was added γ-butyrolactone to 9 wt % as a co-solvent. Triphenylsulfonium trifluoromethanesulfonate was added to the solution to 2 wt % with respect to the copolymer, and thoroughly dissolved therein. After filtering the resulting resist solution with a 0.2 $\mu m$ Teflon™ membrane filter, it was spin coated at 2000 rpm onto an HMDS-treated silicon substrate and prebaked at 120° C. for 60 seconds. This produced a resist film with a thickness of 0.7 $\mu m$. After exposing the resist film to a KrF excimer laser stepper (NA=0.45) it was subjected to post exposure baking (PEB) at 120° C. for 60 seconds, developed with a 2.38% tetramethylammonium hydroxide (TMAH) aqueous solution and rinsed with deionized water for 60 seconds. An exposure dose of 30.0 mJ/cm$^2$ allowed resolution of a 0.25 $\mu m$ line-and-space (L/S) pattern.

The silicon substrate coated with the resist in this manner was placed in a parallel plate RIE apparatus for Ar sputter etching under the following conditions: P$\mu$=200 W, pressure=0.02 Torr, argon (Ar) gas=50 sccm; film thickness measurement confirmed dry etching resistance equivalent to that of the novolac resist, Nagase Positive Resist NPR-820 (product of Nagase Industries).

Example 4

Formation of Resist Pattern

The procedure described in Example 3 was repeated, but for this example the resist film thickness was changed from 0.7 $\mu m$ to 0.4 $\mu m$, and an ArF excimer laser exposure apparatus (NA=0.55) was used, instead of the KrF excimer laser stepper, as the exposure apparatus. In this example, an exposure dose of 10.0 mJ/cm$^2$ allowed resolution of a 0.20 $\mu m$ L/S pattern. The other properties of the obtained resist pattern were satisfactorily comparable to the properties of Example 3.

Example 5

Formation of Resist Pattern

The procedure described in Example 3 was repeated, but for this example an equivalent amount of diphenyliodonium trifluoromethanesulfonate was added instead of triphenylsulfonium trifluoromethanesulfonate for preparation of the resist solution, the resist film thickness was changed from 0.7 $\mu m$ to 0.4 $\mu m$, and an ArF excimer laser exposure apparatus (NA=0.55) was used, instead of the KrF excimer laser stepper, as the exposure apparatus. In this example, an exposure dose of 8.0 mJ/cm$^2$ allowed resolution of a 0.20 $\mu m$ L/S pattern. The other properties of the obtained resist pattern were satisfactorily comparable to the properties of Example 3.

Example 6

Synthesis of Methyacryloxysuccinic Anhydride/isobornyl Methacrylate Copolymer

A stirrer bar coated with Teflon™ was added into a thoroughly dried 100 ml Erlenmeyer flask together with 5.41 g (29.4 millimoles) of the methacryloxysuccinic anhydride prepared in Example 1, 6.54 g (29.4 millimoles) of isobornyl methacrylate, 1.44 g (8.8 millimoles, 15 mole percent) of azobisisobutyronitrile (AIBN). and 19.6 ml of dioxane, and the mixture was stirred at 70° C. for 8 hours under a nitrogen atmosphere. After diluting the resulting reaction solution with tetrahydrofuran (THF), it was added dropwise to 1 liter of hexane containing a small amount of hydroquinone to produce a precipitate. The produced precipitate was filtered with a glass filter and dried for a period of 16 hours at 0.1 mmHg, 45° C. The resulting white powder was dissolved in THF and subjected twice to the aforementioned procedure from hexane precipitate production through drying. This yielded a white copolymer powder having the structural formula shown below. The yield was 9.56 g (80%).

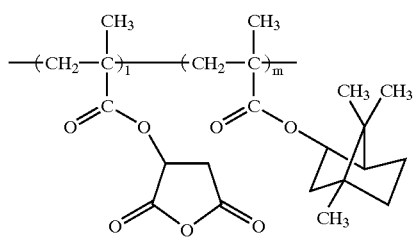

$^1$H-NMR analysis revealed that the copolymerization ratio of the obtained copolymer (l:m), or succinic anhydride:isobornyl, was 49:51. The absorbance of the copolymer was 0.044 $\mu m^{-1}$ at a wavelength of 248 nm and 0.21 $\mu m^{-1}$ at 193 nm (film thickness: 1 $\mu m$, on quartz substrate), demonstrating excellent transparency. The other analysis results were as follows.

Weight average molecular weight: 18,200 (based on standard polystyrene)

Degree of dispersion (Mw/Mn): 1.88.

Example 7

Formation of Resist Pattern

The methyacryloxysuccinic anhydride/isobornyl methacrylate copolymer synthesized in Example 6 was dissolved in propyleneglycol methyl ether acetate (PGMEA) to make a 15 wt % solution. To this copolymer solution there was added γ-butyrolactone to 9 wt % as a co-solvent. Triphenylsulfonium trifluoromethanesulfonate was added to the solution to 2 wt % with respect to the copolymer, and thoroughly dissolved therein. After filtering the resulting resist solution with a 0.2 $\mu m$ Teflon™ membrane filter, it was spin coated at 2000 rpm onto an HMDS-treated silicon substrate and prebaked at 120° C. for 60 seconds. This produced a resist film with a thickness of 0.4 $\mu m$. After exposing the resist film to an ArF excimer laser exposure apparatus (NA=0.55) it was subjected to post exposure baking (PEB) at 130° C. for 60 seconds, developed with a 2.38% tetramethylammonium hydroxide (TMAH) aqueous solution and rinsed with deionized water for 60 seconds. An exposure dose of 20.0 mJ/cm$^2$ allowed resolution of a 0.20 $\mu m$ L/S pattern.

The silicon substrate coated with the resist in this manner was placed in a parallel plate RIE apparatus for Ar sputter etching under the following conditions: P$\mu$=200 W. pressure=0.02 Torr, argon (Ar) gas=50 sccm; film thickness measurement confirmed dry etching resistance equivalent to that of the novolac resist, Nagase Positive Resist NPR-820 (product of Nagase Industries).

INDUSTRIAL APPLICABILITY

By using a resist composition according to the present invention it is possible to form fine positive resist patterns with practical sensitivity and no swelling.

High sensitivity and resolution can easily be achieved with the acid sensitive copolymer of this resist composition, by including a carboxyl group that is protected with a protecting group comprising a succinic anhydride with a prescribed structure, on the side chain of a first monomer unit, while also including a carboxyl group that is protected with an acid-unstable protecting group, on the side chain of a second monomer unit.

When the protecting group of the second monomer unit in the acid sensitive copolymer is a polycyclic alicyclic hydrocarbon group such as an adamantyl group, high RIE resistance is exhibited; also, since the copolymer itself contains no chromophores with a large absorption coefficient in the deep ultraviolet region, it is possible to provide novel high sensitivity resists that are suitable for extremely short wavelength light sources such as ArF excimer lasers.

What is claimed is:

1. An acid sensitive copolymer which is formed by copolymerization of two or more different monomers, the polymer being characterized in that (1) it is insoluble itself in basic aqueous solutions, but is rendered soluble in basic aqueous solutions when the protecting group of the protected carboxyl group bonded to the side chain of the first monomer unit of the copolymer is removed by the action of the acid, (2) the protecting group of the carboxyl group comprises an acid anhydride portion represented by the following formula (I):

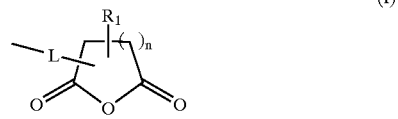

where $R_1$ represents a hydrogen atom or represents one or more substituents selected from the group consisting of alkyl, alkoxy and alkoxycarbonyl groups, and when more than one $R_1$ substituent is present the substituents may be the same or different, L is either absent or represents a linking group comprising a linear or branched hydrocarbon group with 1 to 6 carbon atoms, and n is an integer of 1 to 4;

(3) the second monomer unit of the copolymer further contains, bonded to its side chain, an acidic functional group protected with an acid-unstable protecting group; and (4) it has a weight average molecular weight of 2,000 to 1,000,000.

2. An acid sensitive copolymer according to claim 1, characterized in that the acid anhydride portion represented by formula (I) is succinic anhydride.

3. An acid sensitive copolymer according to claim 1, characterized in that the acidic functional group protected with an acid-unstable protecting group in said second monomer is a carboxyl group protected with a protecting group represented by the following formula (II):

(II)

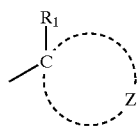

where $R_1$ represents a linear or branched alkyl group of 1 to 4 carbon atoms and may be either substituted or unsubstituted, and Z represents atoms necessary to complete the alicyclic hydrocarbon group along with the carbon atom to which $R_1$ is bonded.

4. An acid sensitive copolymer according to claim 3, characterized in that said protecting group-containing carboxyl group is represented by the following formula (III):

(III)

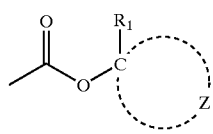

where $R_1$ and Z are both as defined above.

5. An acid sensitive copolymer according to claim 1, characterized in that said copolymer monomer unit is one selected from the group consisting of (meth)acrylate-based monomer units, vinylphenol-based monomer units, N-substituted maleimide-based monomer units, norbornanecarboxylic acid-based monomer units, styrene-based monomer units and monomer units with an ester group containing a multiple-or polycyclic alicyclic hydrocarbon portion.

6. An acid sensitive copolymer according to claim 5, characterized in that the alicyclic hydrocarbon group of said monomer unit is an adamantyl group and/or a norbornyl group.

7. An acid sensitive copolymer according to claim 1, characterized by being represented by the following formula (IV) or (V):

(IV)

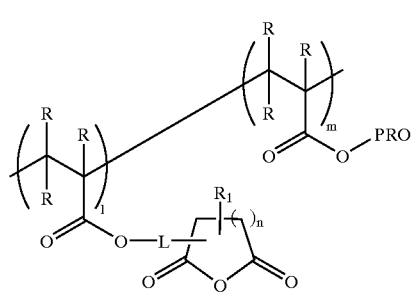

(V)

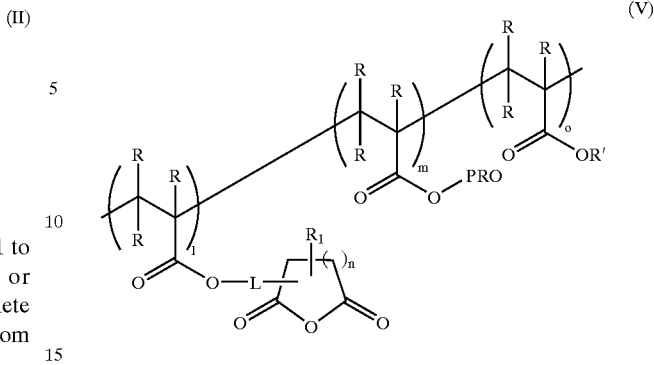

where each R may be the same or different and represents a hydrogen atom or represents a halogen atom, a cyano group or a linear or branched alkyl group of 1 to 4 carbon atoms;

each R' may be the same or different and represents a hydrogen atom or a linear or branched alkyl group of 1 to 4 carbon atoms;

PRO represents an acid-removable protecting group that can be removed by the action of an acid;

l, m and o are the molar ratios of each monomer unit, where l+m=1 or l+m+o=1; and $R_1$, L and n in the formulas are each as defined above.

8. An acid sensitive copolymer according to claim 7, characterized in that the acid-removable protecting group PRO in formula (IV) or (V) is a protecting group represented by the following formula (II):

(II)

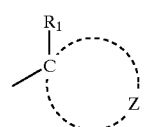

where $R_1$ represents a linear or branched alkyl group of 1 to 4 carbon atoms, which may be either substituted or unsubstituted, and Z represents atoms necessary to complete the alicyclic hydrocarbon group along with the carbon atom to which $R_1$ is bonded.

9. A resist composition according to any one of claims 1 to 8, characterized in that a photo acid generator that can generate an acid as a result of decomposition upon absorption of image-forming radiation is used to prepare the resist composition.

10. A resist composition capable of being developed in basic aqueous solutions, characterized by comprising the following components:
(a) an acid sensitive copolymer which is formed by copolymerization of two or more different monomers such that
(1) it is insoluble itself in basic aqueous solutions, but is rendered soluble in basic aqueous solutions when the protecting group of the protected carboxyl group bonded to the side chain of the first monomer unit of the copolymer is removed by the action of the acid,
(2) the protecting group of the carboxyl group comprises an acid anhydride portion represented by the following formula (I):

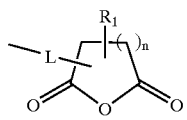

(I)

where
- $R_1$ represents a hydrogen atom or represents one or more substituents selected from the group consisting of alkyl, alkoxy and alkoxycarbonyl groups, and when more than one $R_1$ substituent is present the substituents may be the same or different,
- L is either absent or represents a linking group comprising a linear or branched hydrocarbon group with 1 to 6 carbon atoms, and
- n is an integer of 1 to 4;
  (3) the second monomer unit of the copolymer further contains, bonded to its side chain, an acidic functional group protected with an acid-unstable protecting group; and
  (4) it has a weight average molecular weight of 2,000 to 1,000,000; and
(b) a photo acid generator capable of generating an acid that can induce removal of the protecting group of the carboxyl group in said first monomer unit and the acid-unstable protecting group in said second monomer unit, when decomposed by absorption of image-forming radiation.

11. A resist composition according to claim 10, characterized in that when it is used to form a film by application onto a quartz substrate, it has an absorbance of 1.75 $\mu m^{-1}$ at the wavelength of the deep ultraviolet exposure light source (180 to 300 nm).

12. A resist composition according to claim 10, characterized by being in the form of a solution in a solvent selected from the group consisting of ethyl lactate, methyl amyl ketone, methyl-3-methoxypropionate, ethyl-3-ethoxypropionate, propyleneglycol methyl ether acetate and mixtures thereof.

13. A resist composition according to claim 12, characterized by further containing as a co-solvent, a solvent selected from the group consisting of butyl acetate, γ-butyrolactone, propyleneglycol methyl ether and mixtures thereof.

14. A method for the formation of resist patterns, which comprises the following steps:
(A) a step of coating onto a target substrate, a resist composition comprising the following components:
  (a) an acid sensitive copolymer which is formed by copolymerization of two or more different monomers such that
    (1) it is insoluble itself in basic aqueous solutions, but is rendered soluble in basic aqueous solutions when the protecting group of the protected carboxyl group bonded to the side chain of the first monomer unit of the copolymer is removed by the action of the acid,
    (2) the protecting group of the carboxyl group comprises an acid anhydride portion represented by the following formula (I):

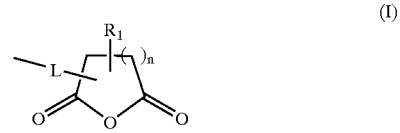

(I)

where
- $R_1$ represents a hydrogen atom or represents one or more substituents selected from the group consisting of alkyl, alkoxy and alkoxycarbonyl groups, and when more than one $R_1$ substituent is present the substituents may be the same or different,
- L is either absent or represents a linking group comprising a linear or branched -hydrocarbon group with 1 to 6 carbon atoms, and
- n is an integer of 1 to 4;
  (3) the second monomer unit of the copolymer further contains, bonded to its side chain, an acidic functional group protected with an acid-unstable protecting group; and
  (4) it has a weight average molecular weight of 2,000 to 1,000,000; and
(b) a photo acid generator capable of generating an acid that can induce removal of the protecting group of the carboxyl group in said first monomer unit and the acid-unstable protecting group in said second monomer unit, when decomposed by absorption of image-forming radiation;
(B) a step of selectively exposing the formed resist film to image-forming radiation that can induce decomposition of the photo acid generator of said resist composition, and
(C) a step of developing the exposed resist film with a basic aqueous solution.

* * * * *